(12) United States Patent
Sharma et al.

(10) Patent No.: US 7,972,521 B2
(45) Date of Patent: Jul. 5, 2011

(54) METHOD OF MAKING RELIABLE WAFER LEVEL CHIP SCALE PACKAGE SEMICONDUCTOR DEVICES

(75) Inventors: Umesh Sharma, Santa Clara, CA (US); Harry Yue Gee, Sunnyvale, CA (US); Phillip Gene Holland, Los Gatos, CA (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 283 days.

(21) Appl. No.: 11/685,085

(22) Filed: Mar. 12, 2007

(65) Prior Publication Data

US 2008/0227240 A1 Sep. 18, 2008

(51) Int. Cl.
*H05K 3/00* (2006.01)
(52) U.S. Cl. .......... 216/13; 216/17; 216/18; 216/52; 427/96.5; 29/832; 438/106
(58) Field of Classification Search ............. 216/17
See application file for complete search history.

(56) References Cited

U.S. PATENT DOCUMENTS

| | | | | |
|---|---|---|---|---|
| 5,268,072 A * | 12/1993 | Agarwala et al. | ................ | 216/13 |
| 5,287,003 A * | 2/1994 | Van Andel et al. | ............. | 257/792 |
| 5,986,335 A * | 11/1999 | Amagai | ........................ | 257/668 |
| 6,277,669 B1 | 8/2001 | Kung et al. | | |
| 6,312,974 B1 | 11/2001 | Wu et al. | | |
| 6,316,820 B1 * | 11/2001 | Schmitz et al. | ............... | 257/649 |
| 2002/0163062 A1 * | 11/2002 | Wang et al. | ................... | 257/641 |
| 2006/0003572 A1 * | 1/2006 | Chen et al. | ..................... | 438/622 |
| 2006/0055035 A1 * | 3/2006 | Lin et al. | ........................ | 257/737 |
| 2007/0007548 A1 * | 1/2007 | Conti et al. | .................... | 257/202 |

OTHER PUBLICATIONS

Riley, G. "Introduction to Flip Chip: What, Why, How"; FlipChips.com, Tutorial 1, Oct. 2000.
"Solder Bump Flip Chip"; FlipChips.com, Tutorial 2, Nov. 2000.
Riley, G., "Stud Bump Flip Chip"; FlipChips.com, Tutorial 3, Dec. 2000.
Patterson, D., "The back-end process: step 7-solder bumping step by step"; *Advanced Packaging*, AP Pennett.com; Jul. 2001.
Riley, G. "Under bump metallization (UBM)"; FlipChips.com, Tutorial 11, Sep. 2001.
"Controlling stress in thin films"; FlipChips.com, Tutorial 22, Sep. 2002.
Cannella, J., "Flip chip underfill processing"; *Empfasis* (www.empf.org) Jun. 2006.
International Search Report issued Jun. 23, 2008 in corresponding PCT/US2008/56595.

* cited by examiner

*Primary Examiner* — Anita K Alanko
(74) *Attorney, Agent, or Firm* — Pillsbury Winthrop Shaw Pittman LLP

(57) ABSTRACT

The present invention relates to a method of making a robust wafer level chip scale package and, in particular, a method that prevents cracking of the passivation layer during solder flow and subsequent multiple thermal reflow steps. In one embodiment, a passivation layer that is formed using an insulating material applied in a highly compressive manner is used. In another aspect, another layer is applied over the passivation layer to assist with preventing cracking of the passivation layer.

22 Claims, 5 Drawing Sheets

US 7,972,521 B2

METHOD OF MAKING RELIABLE WAFER LEVEL CHIP SCALE PACKAGE SEMICONDUCTOR DEVICES

FIELD OF THE INVENTION

The present invention relates to a method of making a robust Wafer Level Chip Scale Package (WLCSP) that prevents cracking of the passivation layer during solder flow and subsequent multiple thermal reflow steps.

BACKGROUND OF THE INVENTION

WLCSP technology is a commonly used wafer level packaging method for integrated circuits. Two commonly used WLCSP technologies are the solder "ball drop" method and the solder "screen print" method. Both of these technologies are routinely used in a standard manufacturing environment enabling the production of devices with I/O pitch finer than 0.4 mm.

In the "ball drop" WLCSP process, as shown in FIG. 1(a), on the wafer 100 each of the different areas 110 that will subsequently correspond to a chip. As shown in FIG. 1(b), within an area 110, there will exist a plurality of bond pads 120 (though only one is shown) used by each chip to establish electrical connections to the chip that are formed in a top layer of the metal, with the remainder of the integrated circuit below (not shown). Over the bond pads 120 is deposited a passivation layer 130, that will then have formed passivation openings 140 (shown in the dotted line area) to expose the bond pads 120 below. After the passivation openings 140 are defined on the wafer 100, a typical CSP process involves depositing and patterning an under bump material (UBM) layer 150 (which may have a plurality of different layers), followed by dropping a solder ball 160 in each of the passivation opening 140. The wafer 100 is then subjected to a thermal cycle during which each of the solder balls 160 melts (also referred to as re-flowed) and then cools in a well defined shape on top of the UBM layer 150.

Alternately, in the "screen print" method, after defining the UBM layer, solder paste is squeezed through a mask and deposited on top of the UBM layer. The wafer is then subjected to a thermal reflow cycle during which the solder paste melts and then cools forming a well defined shape on top of the UBM layer.

One drawback of these methods, as shown in FIG. 1(b), is the formation of fractures or cracks 170 in the passivation layer 130 that can occur during the solder reflow process. The thermo-mechanical stress on the passivation layer 130 during the reflow process is significant enough to cause a complete fracture of the passivation film 130. After the wafer 100 is sawed and the areas 110 are separated to become the individual integrated circuits (ICs) 200, the cracks 170 remain in the passivation film 130, thereby exposing the underlying circuits to the ambient environment.

In most applications, the IC 200 is mounted on a printed circuit board (PC) 210 as shown in FIG. 2, using conventional solder flux, paste and another reflow step to melt the solder balls 160 and attach the IC 200 to the PC board 210. During this assembly process, chemicals such as the solder flux can migrate through the passivation cracks 170 and attack the underlying circuits. The extent of damage depends on the type and concentration of the chemical as well as the exposure time. In many cases the flux will etch away the metal lines leading to open circuits.

The passivation film is necessary to protect the underlying layers within an integrated circuit from the ambient environment. However, cracks in the passivation layer can easily expose the layers underneath to moisture, ionic contamination, etc., causing the circuit to malfunction.

SUMMARY OF THE INVENTION

The present invention relates to a method of making a robust wafer level chip scale package and, in particular, a method that prevents cracking of the passivation layer during solder flow and subsequent multiple thermal reflow steps.

In one embodiment, a passivation layer that is formed using an insulating material applied in a highly compressive manner is used.

In a particular aspect, the method of making the wafer level chip scale package comprising initially forming a semiconductor wafer containing a plurality of circuits at each of a plurality of different chip areas, wherein the semiconductor wafer includes for each of the plurality of different chip areas a plurality of conductive bond pads connected to conductive wires; then forming a passivation layer over the plurality of conductive bond pads and the conductive wires, the passivation layer being formed using an insulating material applied in a highly compressive manner; removing contact areas from the completed passivation layer to expose certain ones of the plurality of conductive bond pads; applying an underbump material over each of the exposed conductive bond pads; placing a conductive bump over the underbump material associated with each of the certain ones of the plurality of conductive bond pads and attaching it to the underbump material layer using a thermal flow cycle; and dicing the wafer to obtain a plurality of bumped die.

In another aspect, another layer is applied over the passivation layer to assist with preventing cracking of the passivation layer.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION OF THE PREFERRED EMBODIMENTS

The present invention describes a wafer level CSP process that substantially prevents cracking of the passivation layer during the solder flow and subsequent multiple reflow steps.

The described invention is also implemented in a manner that minimizes the overall cost of manufacturing, and as such uses conventional manufacturing techniques and materials. It is understood, however, that the conventional techniques that the present invention uses, which are in the preferred embodiment described for a 0.5 mm pad pitch technology, also allow for implementation of the present invention, with advantageous results, in 0.4 mm pad pitch and smaller pad pitch CSP technologies.

Figure 1A:
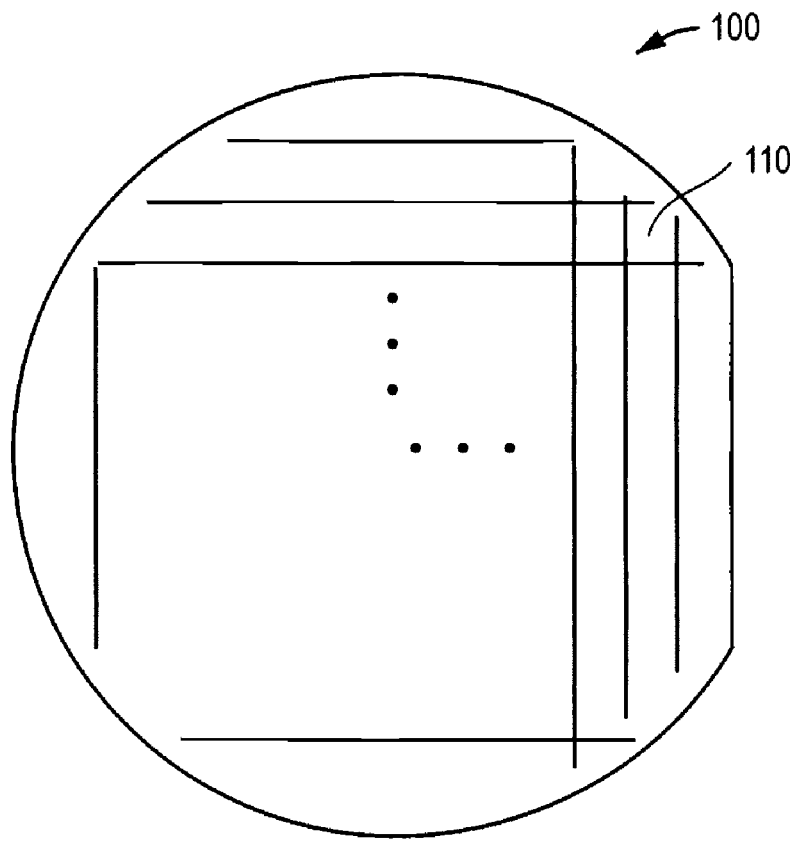
FIG. 1 illustrates a conventional structure for a wafer level CSP solder bump.
Figure 1B:
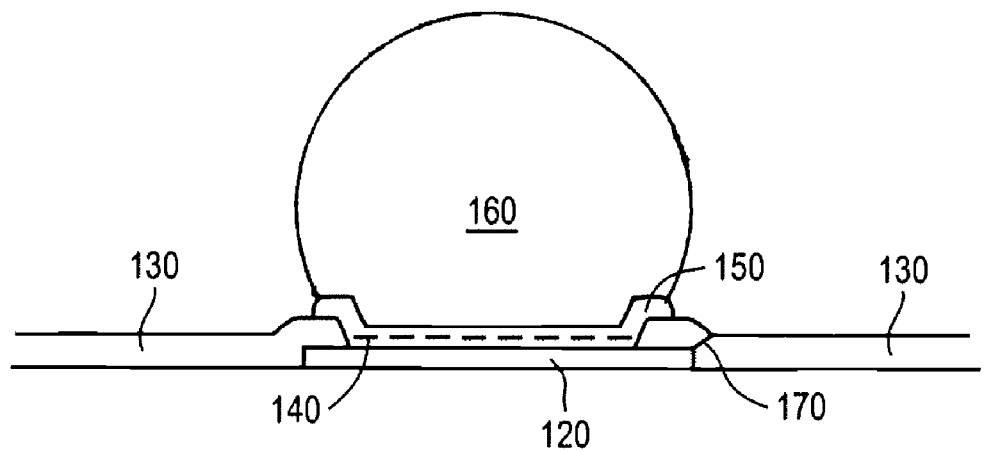
Figure 2:
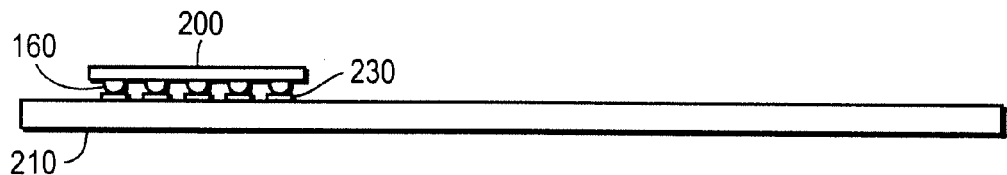
FIG. 2 illustrates a conventional attachment of a die having solder bumps to a PC board.
Figure 5:
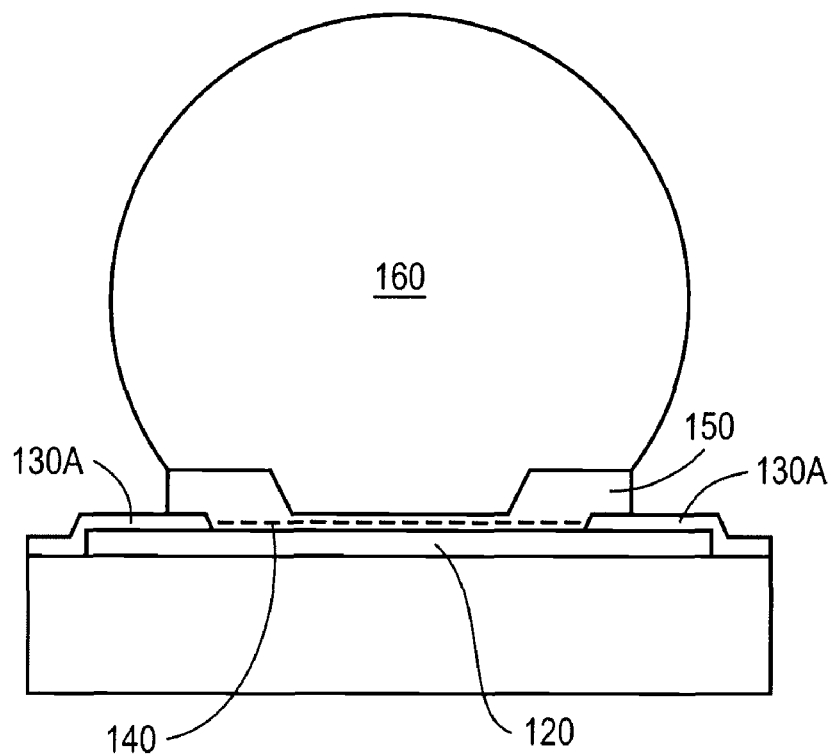
FIG. 5 illustrates the preferred structure of the bond pad according to the present invention.

In certain embodiments, the resulting structure from implementation of the various aspects the methods according to the present invention appears the same as the conventional structure described in the background with respect to FIG. 1, except that the cracks 170 that appear in the conventional structure are eliminated. FIG. 5 illustrates the structure of the present invention, which includes the passivation layer with compressive stress 130A according to the present invention.

Figure 3:
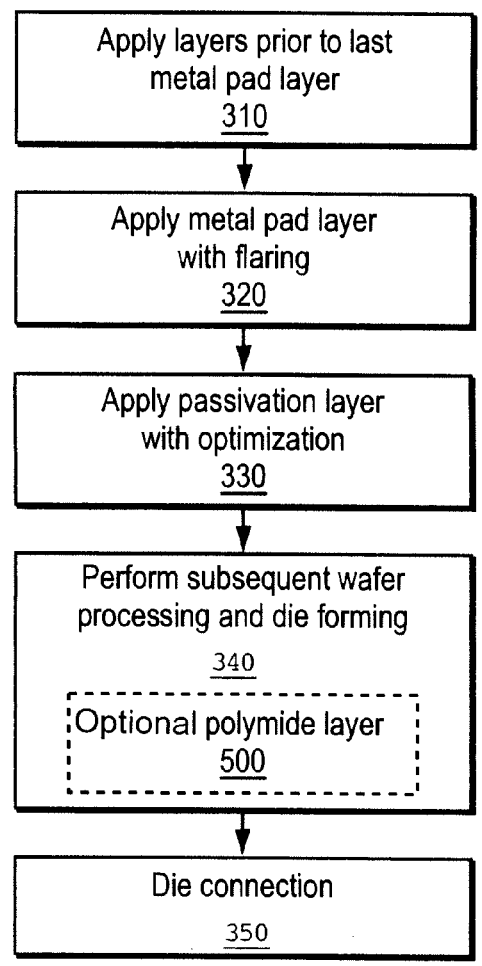
FIG. 3 illustrates a flowchart of the method according to the present invention.

FIG. 3 illustrates a flowchart that outlines one embodiment of the method 300 of the present invention.

In step 310, a wafer is conventionally processed, applying all layers below the last metal layer.

Figure 4A:
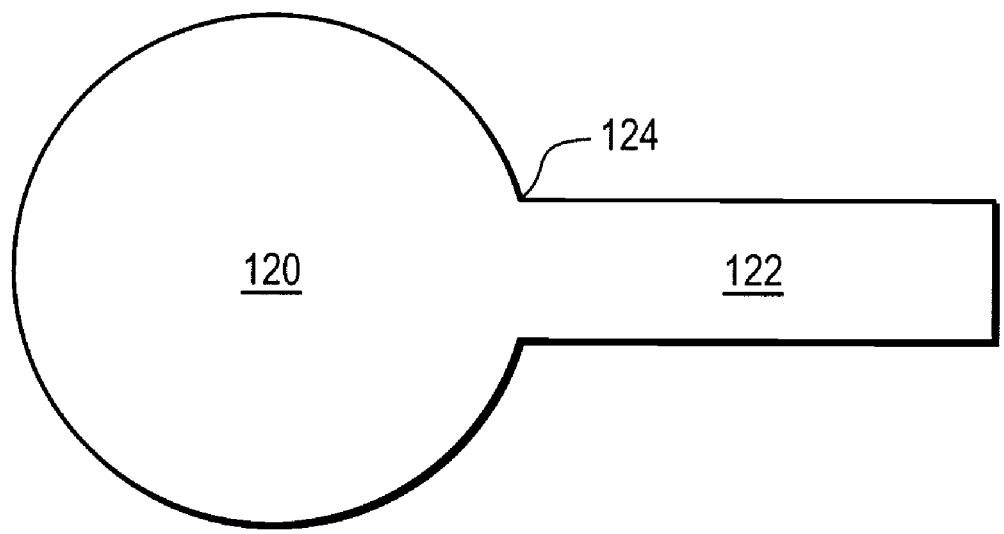
FIGS. 4(a) and 4(b) illustrate a conventional and preferred, respectively, layout of the top interconnect layer of a wafer at a bond pad connection area according to the present invention.
Figure 4B:
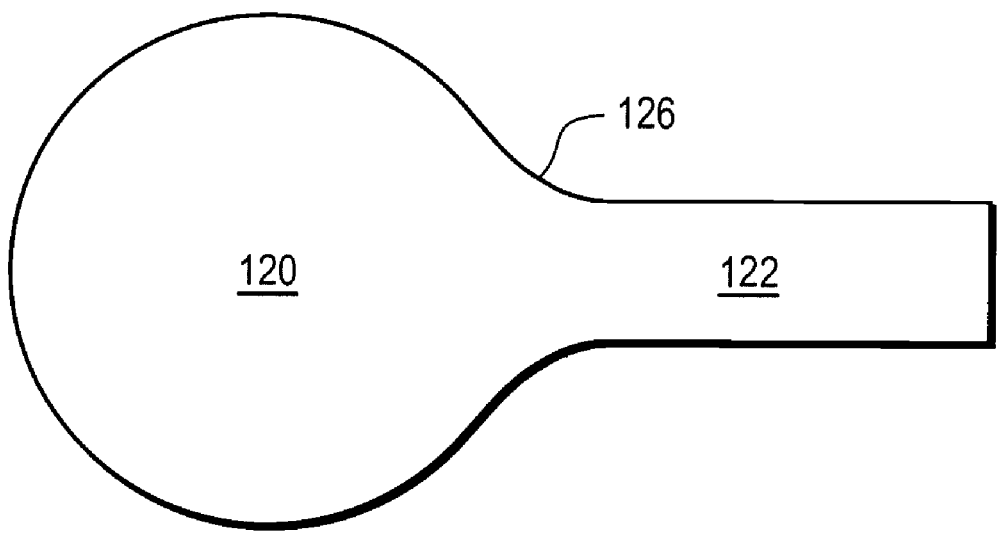

In step 320 the last metal layer that includes the bond pads 120 is applied, and this last metal layer has been optimized to prevent fracture therein. In particular, as shown in FIG. 4(a) at the stress point between the bond pad 120 conducting wire 122, a stress point 124 has been determined to exist, and, as shown in FIG. 4(b) a flaring 126 of the wire at this stress point is preferable in order to reduce the amount of stress at the joint between bond pad 120 and wire 122.

In step 330, there is then applied the passivation layer 130A, which passivation layer 130A has also been optimized for thickness, composition, and/or compressive stress to result in a completed passivation layer.

In particular, optimization of the thickness requires optimizing the overall thickness of the completed passivation layer, which optimization accounts for balancing two competing factors that have been determined: (1) increasing thickness of the passivation layer reduces stress at the junction between the bond pads and the bond wires; but (2) increasing the thickness of the passivation layer increases the overall stress. It has been determined, taking these competing interests into account, that a range of thickness of the passivation layer is 15-25 KA, with a preferred thickness of 17-20 KA. The thickness values are presented for a preferred embodiment in which a dual dielectric stack of silicon dioxide and silicon nitride is used as the passivation material. It should be clear to anyone skilled in the arts that changing the material and/or the stack will result in different thickness ranges.

Optimization of the composition requires material composition of the passivation layer. It has been determined that a multi-layer passivation layer as a completed passivation layer, with a first layer being a silicon nitride film and the second layer being a deposited oxide film, is also advantageous.

In a preferred embodiment, the compressive material is silicon nitride, is preferable. It is also preferred that the thickness of the nitride film be around 12 KA. Of course other passivation layer material compositions can be used within the scope of the present invention. The nitride and oxide compounds are routinely already used, and as such can be easily inserted into the overall processing.

Optimization of the compressive stress in the passivation layer 130A requires depositing the nitride passivation layer in a compressive manner. In particular, applying the passivation material with a compressive stress that is greater than about −5 dynes/cm$^2$, which is a highly compressive stress relative the previously deposited plurality of layers. Further, if there is a multilayer passivation, compression of only the top layer is needed in order to achieve the advantages of the present invention.

Figure 7:
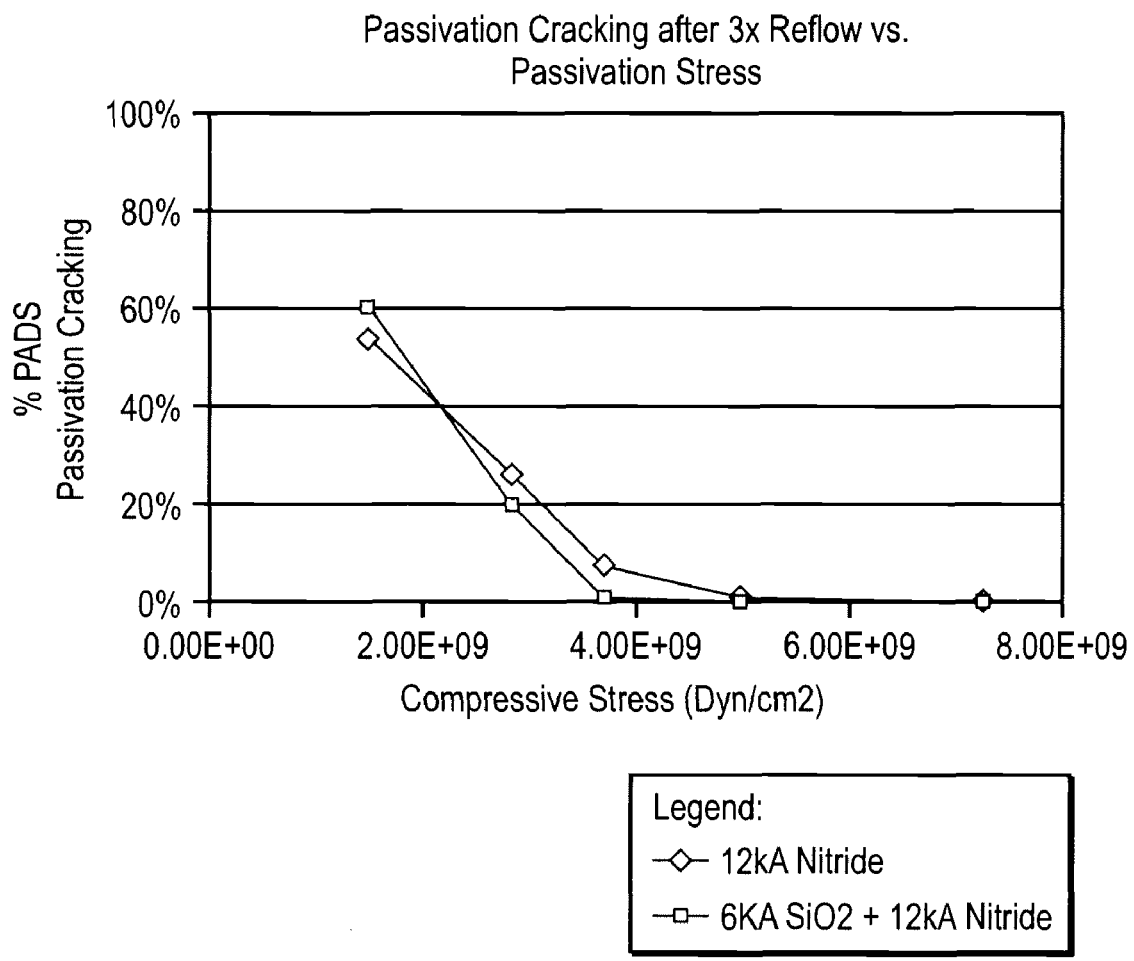
FIG. 7 illustrates a passivation cracking vs passivation stress chart for various materials according to the present invention.

FIG. 7 shows the relationship between passivation cracks and the stress in the passivation layer 130A. From this figure it is quite clear that compressive stress in excess of 5E9 dynes/cm2 is necessary to eliminate cracks for a nitride film thickness of 12 KA and oxide film thickness of 6 KA. This value could be higher or lower for other combinations of passivation thickness and materials.

In step 340, subsequent conventional wafer processing steps occur, including passivation openings 140 to expose the bond pads 120, applying and patterning the UBM layer 150, dropping a solder ball 160 in each of the passivation opening 140, subjecting the wafer 100 to a thermal cycle during which the each of the solder balls 160 melts and then cools in a well defined shape on top of the UBM layer 150, and cutting the wafer 100. Thereafter, die connection step 350 occurs, in which each of the die 200 are placed at the appropriate connection point, and then a thermal cycle occurs to reflow the solder balls 160 to establish connection to the PC board 210.

Not all of the steps described in FIG. 3 are necessary in order to obtain certain of the advantageous features of the present invention. In particular, usage of any one of optimizations in step 330, or any combination of them, will allow for the advantageous structure without the cracks 170 in the passivation layer 130A. Further, the optimization of step 320, while preferred, need not be used to obtain the advantages according to the present invention.

An advantage of the present invention is that even if the passivation layer is subjected to a large number of thermal cycles (such as 10) for reflowing other integrated circuits on the same printed circuit board, that even with such a large number of thermal cycles the cracking of the passivation layer is completely eliminated.

A further advantage of the present invention is that the usage of a passivation layer without any cracks prevents moisture, hydrogen, ionic contaminants and other foreign species from coming into contact with the conductive elements disposed adjacent and below the passivation layer.

Figure 6:
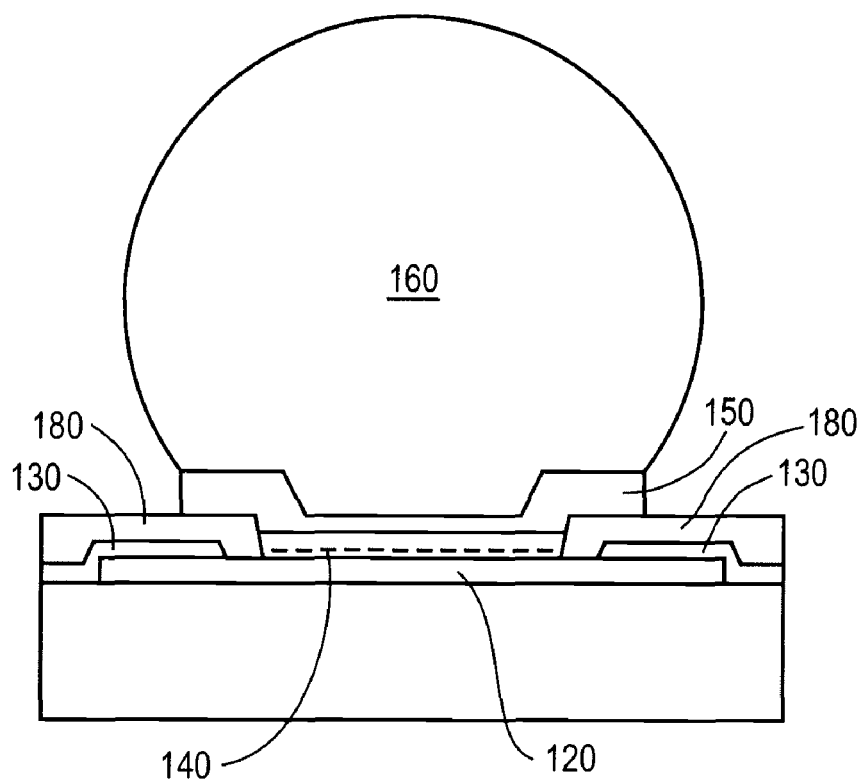
FIG. 6 illustrates another embodiment of a structure to protect the passivation layer and the underlying layers of the wafer according to the present invention.

In an alternate embodiment, illustrated in FIG. 6, and shown as step 500 in FIG. 3, a thick layer of a protective film 180 (typically 5-10 um of polimide] is deposited on top of the passivation layer 130 and then openings are made in the polyimide layer using conventional photolithographic techniques. The protective film, in order to perform appropriately and assist in providing a layer that will not crack, should have a coefficient of thermal expansion that is at least 5-10 times that of the passivation layer, and a Young's Modulus that is smaller than that of the passivation layer. In embodiments in which the passivation layer is silicon dioxide and/or nitride (which have a coefficient of thermal expansion of about 1-4 ppm/oK), a preferred protective layer is a polyimide film, which has a coefficient of thermal expansion that is about 30 ppm/ppm/oK, as well as a Young's Modulus of 2-4 GPa, which is greater that of the silicon nitride (which has a Young's Modulus of 290 GPa) and that of an oxide (which has a Youn'g Modulus of about 68 GPa).

The protective film 180, due to its large coefficient of thermal expansion can withstand the thermo-mechanical stress better and therefore does not crack. Even though the passivation layer 130 underneath might crack, the protective film 180 seals the IC circuitry from the environment.

The foregoing description of the exemplary embodiments of the invention has been presented only for the purposes of illustration and description and is not intended to be exhaustive or to limit the invention to the precise forms disclosed. Many modifications and variations are possible in light of the above teachings.

What is claimed is:

1. A method of making a wafer level chip scale package comprising the steps of:
   forming a semiconductor wafer containing a plurality of circuits in a plurality of layers at each of a plurality of different chip areas, wherein the semiconductor wafer includes for each of the plurality of different chip areas a plurality of conductive bond pads connected to conductive wires;
   creating a compressive stress within a passivation layer that is applied directly on the plurality of conductive bond pads and the conductive wires, the compressive stress being created using an insulating material for the passivation layer, which insulating material is applied in a highly compressive manner relative to the plurality of layers, thereby causing a completed passivation layer to maintain the compressive stress therein, such that the compressive stress will substantially minimize cracks within the passivation layer during subsequent processing;
   removing contact areas from portions of the passivation layer to expose certain ones of the plurality of conductive bond pads, wherein the compressive stress within remaining portions of the passivation layer is maintained after the step of removing contact areas is completed;
   applying an underbump material over each of the exposed conductive bond pads;
   placing a conductive bump over the underbump material associated with each of the certain ones of the plurality of conductive bond pads and attaching it to the underbump material using a thermal flow cycle; and
   dicing the wafer to obtain a plurality of bumped die, wherein the compressive stress of the completed passivation layer in an area surrounding each of the plurality of conductive bond pads is maintained after the step of dicing the wafer is completed.

2. The method according to claim 1 wherein the step of applying includes the steps of depositing an underbump material layer, photolithographically defining an area for the underbump material and removing excess of the underbump material layer to define the underbump material; and further comprising the steps of:
   mounting one of the bumped die onto a surface of a printed circuit board, thereby establishing electrical connection between a conductive pad on the printed circuit board to a corresponding conductive bump on the bumped die, the step of mounting including reflowing each of the conductive bumps and thereby establish electrical contact between each of the electrical contacts and associated ones of the conductive bond pads, and wherein during reflowing the integrity of the passivation layer is maintained due to the usage of the insulating material applied in the highly compressive manner relative to the plurality of layers.

3. The method according to claim 2 further including the steps of:
   mounting at least one other die onto the surface after the step of mounting the one bumped die, wherein the step of mounting the at least one other die causes a further thermal cycle on the passivation layer of the one bumped die, and the integrity of the passivation layer is maintained during the further thermal cycle due to the usage of the insulating material applied in the highly compressive manner relative to the plurality of layers.

4. The method according to claim 3 wherein the step of mounting is repeated multiple times, thereby causing additional thermal cycles, and wherein the integrity of the passivation layer is maintained during the additional thermal cycles due to the usage of the insulating material applied in the highly compressive manner relative to the plurality of layers.

5. The method according to claim 1 wherein the insulating material applied in the highly compressive manner relative to the plurality of layers includes a silicon nitride layer with a stress value that is greater than 5E9 dynes/cm2.

6. The method according to claim 5 wherein the insulating material that forms the completed passivation layer is formed as a plurality of passivation layers, including a silicon nitride layer and a silicon dioxide layer, wherein at least a top one of the plurality of passivation layers is applied in the highly compressive manner relative to the plurality of layers to maintain compressive stress in the completed passivation layer that will substantially minimize cracks therein during subsequent processing.

7. The method according to claim 6 wherein the completed passivation layer has a thickness between 15-25 KA.

8. The method according to claim 7 wherein the completed passivation layer has a thickness between 17-20 KA.

9. The method according to claim 1 wherein the completed passivation layer has a thickness between 10-25 KA.

10. The method according to claim 1 wherein the completed passivation layer has a thickness between 17-20 KA.

11. The method according to claim 10 wherein the insulating material is silicon nitride.

12. The method according to claim 11 wherein the insulating material that forms the completed passivation layer is formed as a plurality of passivation layers, including a silicon nitride layer and a silicon dioxide layer.

13. The method according to claim 9 wherein the insulating material is silicon nitride.

14. The method according to claim 13 wherein the insulating material that forms the completed passivation layer is formed as a plurality of passivation layers, including an silicon nitride layer and an silicon dioxide layer.

15. The method according to claim 1, further including a step of forming a protective film over the completed passivation layer, the protective film having a coefficient of thermal expansion that is at least 5 times greater than a coefficient of thermal expansion of the complete passivation layer and a Young's Modulus smaller than that of the completed passivation layer.

16. The method according to claim 1 wherein the completed passivation layer includes a nitride, or a combination of nitride and oxide, and the protective layer includes a polyimide.

17. The method according to claim 1 wherein the step of creating the compressive stress includes forming a plurality of passivation layers as the completed passivation layer, and wherein a top one of the plurality of passivation layers is made with an insulating material that is applied in a compressive manner with a greatest stress value as compared to other ones of the plurality of passivation layers to maintain the highly compressive stress that will substantially minimize cracks therein during subsequent processing.

18. The method according to claim 17 wherein the top one of the plurality of passivation layers is a silicon nitride layer with a stress value that is greater than 5E9 dynes/cm2.

19. The method according to claim 18 wherein the completed passivation layer has a thickness between 17-20 KA.

20. The method according to claim 1 wherein the step of creating the compressive stress includes forming a plurality of passivation layers as the completed passivation layer, and wherein each of the plurality of passivation layers is made with an insulating material that is applied in a highly compressive manner relative to the plurality of layers to maintain compressive stress that will substantially minimize cracks therein during subsequent processing.

21. The method according to claim 20 wherein at least one of the plurality of passivation layers is a silicon nitride layer with a stress value that is greater than 5E9 dynes/cm2.

22. The method according to claim 21 wherein the completed passivation layer has a thickness between 17-20 KA.

* * * * *